United States Patent [19]
Gross

[11] Patent Number: 4,827,223
[45] Date of Patent: May 2, 1989

[54] BUFFER AMPLIFIER

[75] Inventor: William H. Gross, Sunnyvale, Calif.

[73] Assignee: Elantec, Milpitas, Calif.

[21] Appl. No.: 171,035

[22] Filed: Mar. 21, 1988

[51] Int. Cl.$^4$ .............................................. H03F 3/30
[52] U.S. Cl. .................................... 330/267; 330/263
[58] Field of Search ....................... 330/263, 267, 268

[56] References Cited
U.S. PATENT DOCUMENTS
3,537,023 10/1970 Myer ............................... 330/268 X FOREIGN PATENT DOCUMENTS
35520 3/1980 Japan ................................... 330/267

Primary Examiner—James B. Mullins
Attorney, Agent, or Firm—A. C. Smith

[57] ABSTRACT

An improved direct-coupled amplifier includes a push-pull pair of transistors in an output stage that provides high output current on low quiescent current. Each such output transistor is driven by a push-pull pair of driver transistors that receives the applied signal at proper bias levels provided by forward-biased diodes (or diodes and gain element) to provide high input impedance to low output impedance signal buffering with wide bandwidth at high power levels.

4 Claims, 1 Drawing Sheet

BUFFER AMPLIFIER

BACKGROUND OF THE INVENTION

Field of the Invention

This invention relates to direct-coupled linear amplifiers and more particularly to amplifier circuitry having increased bandwidth at elevated output power levels and low quiescent current.

Certain conventional amplifier circuits provide output signals at high power levels by using push-pull output stages. In order to assure good linearity and high output power, such output stages may be biased on in quiescent state and be required to conduct high levels of quiescent current. Amplifier circuits of this type typically exhibit high power dissipation, require larger power supplies, heavier conductors, and are more expensive to fabricate using high-power transistors.

SUMMARY OF THE INVENTION

In accordance with the present invention, a voltage-buffering amplifier converts input signals of high source impedance to output signals of low source impedance and high output power levels using a pair of complementary conductivity type transistors in the output stage. Each such output transistor is driven by a pair of complementary conductivity type transistors which are all coupled to receive the input signal.

DESCRIPTION OF THE PREFERRED EMBODIMENT

Figure 1:
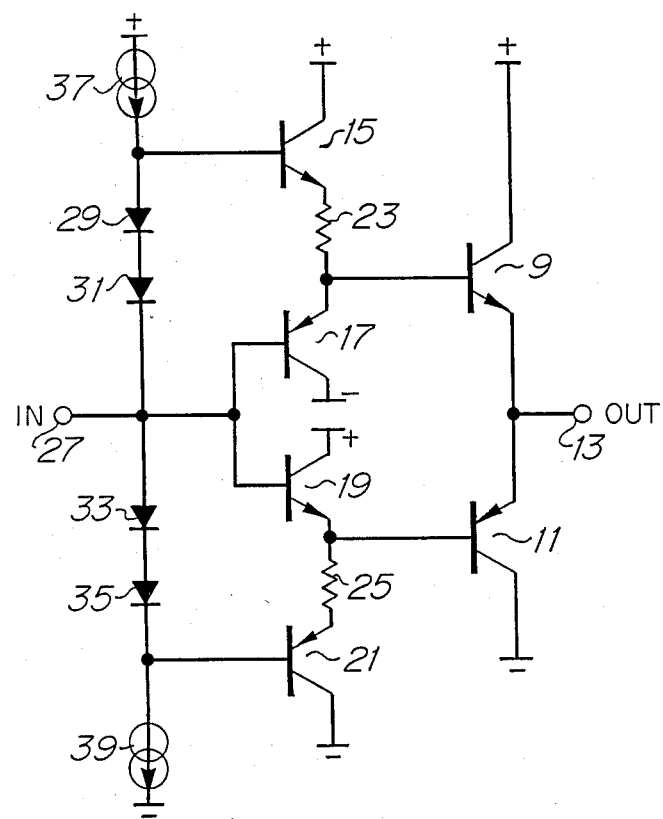
FIG. 1 is a schematic diagram of one embodiment of the invention.

Referring now to FIG. 1, there is shown a schematic diagram of one embodiment of the present invention in which a pair of complementary conductivity type transistors 9, 11 are connected in common collector configuration with the emitters thereof connected to the output node 13. Each of these output transistors 9, 11 are driven by the pair of complementary conductivity type transistors 15, 17 and 19, 21 that are also connected in common collector configuration. The emitters of each pair are connected via resistor 23, 25, and the base of each output transistor 9, 11 is connected to the emitter of its respective one of the driver transistors 17, 19. The input signal at node 27 is applied to the bases of all of the driver transistors 15, 17, 19 and 21 via serially-connected diodes 29, 31, 33 and 35 that are biased in forward conduction via current sources 37 and 39. Of course, the current sources 37, 39 may be approximated by high supply voltages and high-value resistors connected between the supply voltages and the respective pairs of diodes 29, 31 and 33 and 35. These diodes provide substantially fixed forward voltage drop thereacross comparable to the base-emitter voltage drops in the driver transistors 15, 17, 19 and 21, and the resistors 23 and 25 thus provide bias control to inhibit thermal instability of the circuit and reduce quiescent supply current.

In operation, the output transistors 9, 11 are alternatively on and off in phase opposition on signals applied thereto of alternating polarity. Signals are applied to the bases of these transistors from the respective driving transistors 15, 17 and 19, 21. These driving transistors in each pair are, in turn, alternately on and off in phase opposition on applied signals of alternating polarity applied in common to their bases via the forward-conducting diode 29–35. These forward-conducting diodes are substantially isolated from the power supplies by the high output source impedances of the current sources 37, 39. The input impedance to the bases of the driving transistors 15, 17, 19 and 21 (directly connected to the input node 27 or connected thereto through pairs of the diodes) is thus maintained high, while the output source impedance of the output node 13 from the emitters of output transistors 9, 11 is maintained low. This assures good bandwidth at high power levels using an efficient biasing scheme that permits low quiescent current in the idle operating condition. Any mismatch in the currents of sources 37 and 39 may appear on current in the input node 27.

Figure 2:
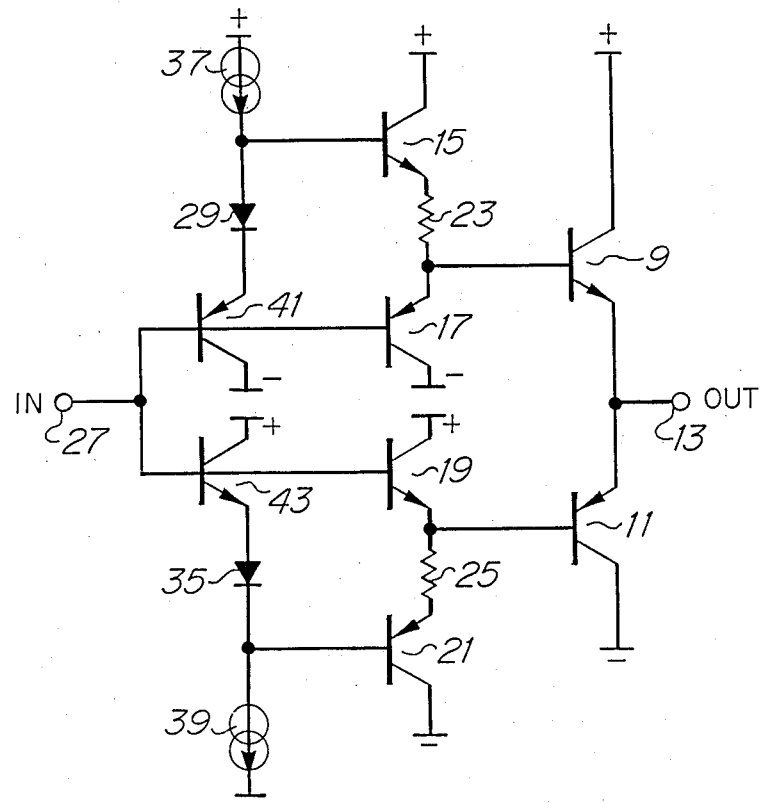
FIG. 2 is a schematic diagram of another embodiment of the present invention using additional input transistors connected to drive the push-pull output stages.

Referring now to FIG. 2, there is shown a schematic diagram of another embodiment of the present invention in which the input to the circuit is modified from the embodiment illustrated in FIG. 1 by the introduction of additional input transistors 41, 43 in lieu of the serially-connected diodes 31 and 33. More specifically, the additional transistors 41 and 43 of complementary conductivity types are connected substantially in parallel with the respective ones of the driver transistors 17 and 19, with the bases thereof connected in common and with the collectors thereof connected in common. In this configuration, input signal on node 27 is applied in common to the complementary driver transistors 17 and 19, and is also applied via the additional transistors 41, 43 and forward-biased diodes 29, 35 to the remaining driver transistors 15 and 21 that are connected in push-pull pairs to the base of each output transistor. The circuit of this embodiment has the advantage of reduced current in the input node 27 attributable to mismatch in currents from sources 37 and 39.

Therefore, the circuit configurations of the present invention assure that the output transistors 9, 11 can also be turned off rapidly by the operation of the respective driver transistors 17, 19 which have the emitter thereof connected directly to the bases of the respective output transistors 9, 11. In this manner, large base currents attributable to accumulated charge can be conducted by the emitters of the respective driver transistors of complementary conductivity types to assume rapid turn-off of the output transistors on appropriate polarities of applied signal.

I claim:

1. An amplifier of applied signal comprising:
   an output stage including a pair of complementary conductivity type transistors connected in common collector configuration with emitters commonly connected to form an output;
   a pair of complementary conductivity type driver transistors for each of said transistors in the output stage, each of said driver transistors being connected in common collector configuration;
   first means coupling the base of each of the transistors in the output stage to the emitters of each of the pair of driver transistors associated therewith; and
   second means coupled to the bases of the driver transistors for supplying the applied signal thereto.

2. An amplifier as in claim 1 wherein said second means includes a plurality of diodes serially connected to be forward biased between bias supplies, said diodes being connected to receive applied signal at a junction thereof and to supply the applied signal to the bases of complementary ones of each of the pairs of said driver transistors; and means coupling the applied signal to the bases of the other complementary ones of each of the pairs of said driver transistors.

3. An amplifier as in claim 1 wherein said second means includes an auxiliary pair of complementary conductivity type transistors connected in common collector configuration with the bases thereof connected to receive applied signal; and means including a forward-biased diode coupling the emitter of each transistor of said auxiliary pair of transistors to the base of an associated driver transistor for supplying applied signal to the bases of said driver transistors.

4. An amplifier as in claim 1 wherein said first means includes a resistor connected solely between the emitters of each of said pairs of driver transistors.

* * * * *